(12) United States Patent
Su et al.

(10) Patent No.: US 8,704,353 B2
(45) Date of Patent: Apr. 22, 2014

(54) THERMAL MANAGEMENT OF STACKED SEMICONDUCTOR CHIPS WITH ELECTRICALLY NON-FUNCTIONAL INTERCONNECTS

(75) Inventors: Michael Su, Round Rock, TX (US); Bryan Black, Spicewood, TX (US); Neil McLellan, Austin, TX (US); Joe Siegel, Brookline, MA (US); Michael Alfano, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 40 days.

(21) Appl. No.: 13/436,066

(22) Filed: Mar. 30, 2012

(65) Prior Publication Data
US 2013/0256872 A1 Oct. 3, 2013

(51) Int. Cl.
*H01L 23/02* (2006.01)

(52) U.S. Cl.
USPC .................. 257/686; 257/778; 257/E21.575; 257/E23.001; 257/E23.141; 257/E23.145; 257/E21.151; 438/109; 438/128; 438/598; 438/618

(58) Field of Classification Search
USPC .................. 257/686, 778, E21.575, E23.001, 257/E23.141, E23.145, E23.151
See application file for complete search history.

(56) References Cited

U.S. PATENT DOCUMENTS

| 2005/0280160 A1 | 12/2005 | Kim et al. |
| 2007/0181992 A1 | 8/2007 | Lake |
| 2010/0171208 A1* | 7/2010 | Fujii .............................. 257/686 |
| 2012/0061852 A1 | 3/2012 | Su et al. |

* cited by examiner

*Primary Examiner* — Asok K Sarkar
(74) *Attorney, Agent, or Firm* — Timothy M. Honeycutt

(57) ABSTRACT

A method of manufacturing is provided that includes fabricating a first plurality of electrically functional interconnects on a front side of a first semiconductor chip and fabricating a first plurality of electrically non-functional interconnects on a back side of the first semiconductor chip. Additional chips may be stacked on the first semiconductor chip.

24 Claims, 8 Drawing Sheets

US 8,704,353 B2

THERMAL MANAGEMENT OF STACKED SEMICONDUCTOR CHIPS WITH ELECTRICALLY NON-FUNCTIONAL INTERCONNECTS

BACKGROUND OF THE INVENTION

1. Field of the Invention

This invention relates generally to semiconductor processing, and more particularly to thermal management structures for stacked semiconductor chips and to methods of assembling the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

Thermal management of a semiconductor chip or chips in a stacked arrangement remains a technical challenge during required electrical testing of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

Some conventional chip stack designs utilize electrically functional micro bumps to establish die-to-die electrical interfaces. These electrically functional micro bumps can transfer some heat from one die to the next. However, the footprints of such electrically functional micro bumps can be relatively small. These electrically functional micro bumps may only cover a small percentage of the surface of a given chip, and thus be inadequate as heat dissipation pathways.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes fabricating a first plurality of electrically functional interconnects on a front side of a first semiconductor chip and fabricating a first plurality of electrically non-functional interconnects on a back side of the first semiconductor chip.

In accordance with another aspect of an embodiment of the present invention, a method of manufacturing is provided that includes stacking a first semiconductor chip on a second semiconductor chip. The first semiconductor chip has a front side facing a back side of the second semiconductor chip. The back side of the second semiconductor chip has plural electrically non-functional interconnects. The first and second semiconductor chips are electrically connected with plural electrically functional interconnects between the front side and the back side. An insulating material is deposited between the first and second semiconductor chips to establish thermal contact with the plural electrically non-functional interconnects.

In accordance with another aspect of an embodiment of the present invention, an apparatus is provided that includes a first semiconductor chip that has a front side and a back side. A first plurality of electrically functional interconnects is on the front side and first plurality of electrically non-functional interconnects is on the back side.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate plural die front side electrically functional interconnects and plural die back side electrically non-functional interconnects. The die back side electrically non-functional interconnects provide a thermal pathway from the back side of a given chip to the front side of the next chip in the stack and so on. An underfill may enhance the thermal pathway. Additional details will now be described.

Figure 1:
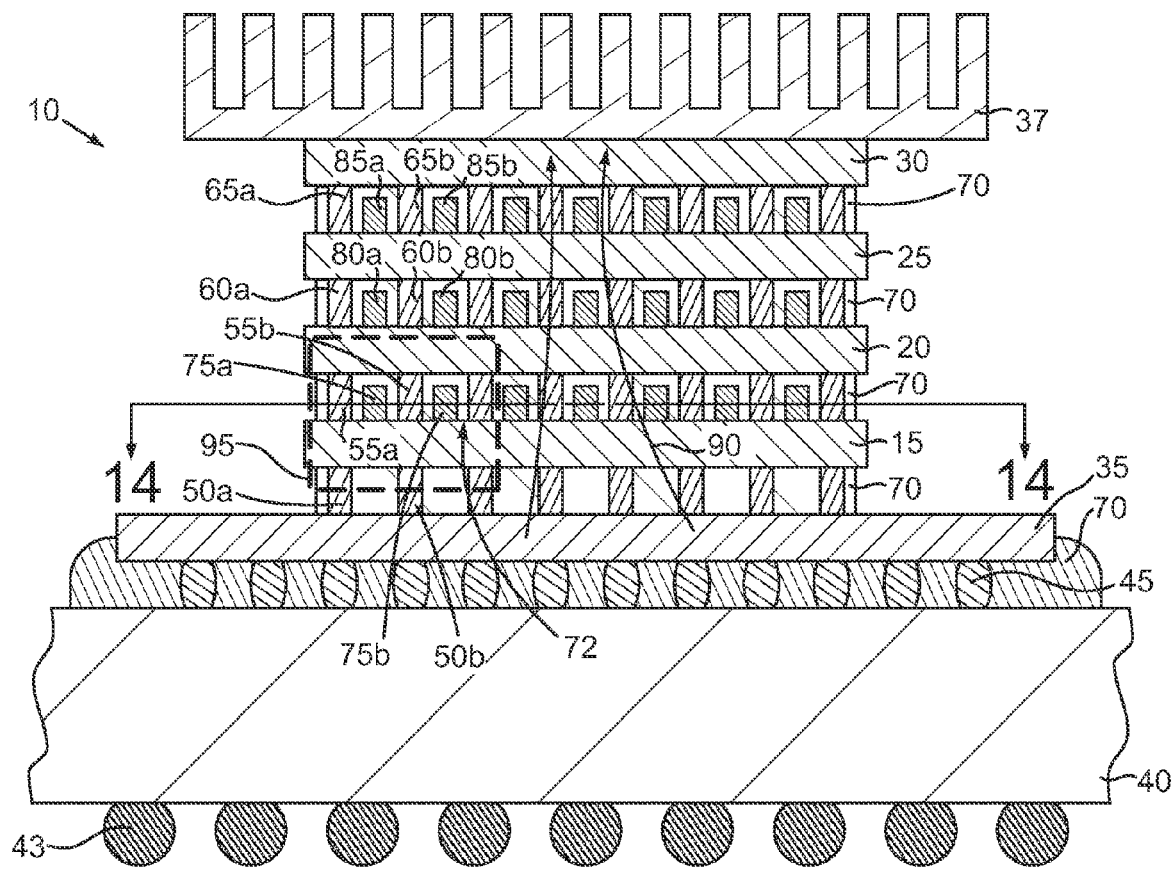
FIG. 1 is a sectional view of an exemplary embodiment of a semiconductor chip device that may include multiple semiconductor chips stacked on a substrate.

In the drawings described below, reference numerals are generally repeated where identical elements appear in more than one figure. Turning now to the drawings, and in particular to FIG. 1, therein is shown a sectional view of an exemplary embodiment of a semiconductor chip device 10 that may include multiple semiconductor chips 15, 20, 25 and 30 stacked on a substrate 35. The substrate 35 may be mounted to a circuit board 40. The semiconductor chips 15, 20, 25 and 30 may be any of a variety of different types of circuit devices used in electronics, such as, for example, microprocessors, graphics processors, combined microprocessor/graphics processors, application specific integrated circuits, memory devices or the like, and may be single or multi-core. The semiconductor chips 15, 20, 25 and 30 may be constructed of bulk semiconductor, such as silicon or germanium, or semiconductor on insulator materials, such as silicon-on-insulator materials. In addition, any of the semiconductor chips 15, 20, 25 and 30 may be configured as a semiconductor interposer, and thus as used herein, the term "chip" is intended to encompass both semiconductor chips and interposers. Other than four semiconductor chips 15, 20, 25 and 30 may be used. Indeed, beneficial aspects may be obtained where two or more chips are used. An optional heat sink 37 may be positioned on the semiconductor chip 30 and constructed of well-known heat sink materials, such as copper, aluminum, stainless steel or others, and take on a variety of mechanical configurations.

The substrate 35 may be a semiconductor chip of the type described above or a circuit board, such as a semiconductor chip package substrate, circuit card or other. In an exemplary embodiment, the substrate 35 may be implemented as a processor, such as a graphics processing unit, and the semiconductor chips 15, 20, 25 and 30 configured as memory devices.

The circuit board 40 may be a semiconductor chip package substrate, a circuit card, or virtually any other type of printed circuit board. Although a monolithic structure could be used for the circuit board 40, a more typical configuration will utilize a build-up design. In this regard, the circuit board 40 may consist of a central core upon which one or more build-up layers are formed and below which an additional one or more build-up layers are formed. The core itself may consist of a stack of one or more layers. So-called "coreless" designs may be used as well. The layers of the circuit board 40 may consist of an insulating material, such as various well-known epoxies or other resins interspersed with metal interconnects. A multi-layer configuration other than buildup could be used. Optionally, the circuit board 40 may be composed of well-known ceramics or other materials suitable for package substrates or other printed circuit boards.

The circuit board 40 is provided with a number of conductor traces and vias and other structures (not shown) in order to provide power, ground and signals transfers between one or more of the semiconductor chips 15, 20, 25 and 30 and the substrate 35 and another circuit device that is not shown. To facilitate those transfers, the circuit board 40 may be provided with input/outputs in the form of the depicted ball grid array 43, a pin grid array, a land grid array or other type of interconnect scheme.

The semiconductor chip device 10 may be provided with multiple types of interconnect structures that are designed to provide electrical conductivity between individual components of the semiconductor chip device 10 or between the circuit board 40 and another electronic device (not shown). For example, the substrate 35 may be connected electrically to the circuit board 40 by way of the plural interconnect structures 45, which may be solder joints consisting of mating portions of solder, copper pillars, with or without solder caps or cladding, micro bumps or other types of interconnect structures. The semiconductor chip 15 may be electrically connected to the substrate 35 by way of plural electrically functional interconnects, two of which are labeled 50a and 50b.

The semiconductor chip 15 and the semiconductor chip 20 may be electrically connected by way of plural electrically functional interconnects, two of which are labeled 55a and 55b, the semiconductor chips 20 and 25 may be electrically connected by plural electrically functional interconnects 60a and 60b, and the semiconductor chips 25 and 30 by way of plural electrically functional interconnects 65a and 65b. Again, it should be understood that there may be many more electrically functional interconnects than illustrated and that only a few are numbered for simplicity of illustration. An underfill material 70 may be applied between the semiconductor chip 15 and the substrate 35 and between the chips 15 and 20, 20 and 25, 25 and 30, respectively. The underfill 70 is designed to lessen the effects of differences in coefficients of thermal expansion of those devices. The back side 72 of the semiconductor chip 15 may be populated with plural electrical non-functional or dummy interconnects, two of which are labeled 75a and 75b. The semiconductor chips 20 and 25 may be similarly populated with electrically non-functional interconnects 80a and 80b and 85a and 85b, respectively. Again, it should be understood that there may be many more electrical non-functional interconnects than illustrated and that only a few are numbered for simplicity of illustration. The topmost chip 30 need not be provided with electrical non-functional interconnects. As described more fully below, the electrical non-functional interconnects 75a and 75b, 80a and 80b, 85a and 85b facilitate the transfer of heat, represented by the arrows 90, from the substrate 35 and from one chip, say the chip 15 to the next chip 20 and so on through the stack of semiconductor chips 15, 20, 25 and 30.

Figure 2:
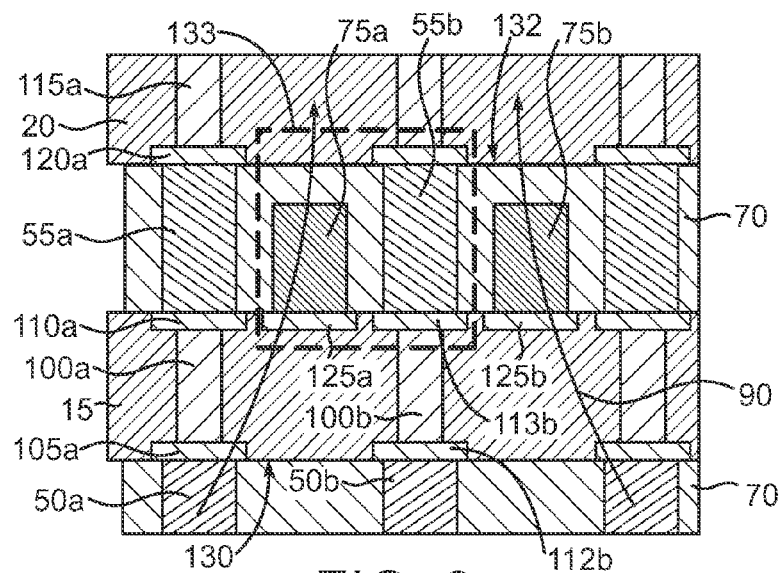
FIG. 2 is a portion of FIG. 1 shown at greater magnification.

Additional details of the semiconductor chip device 10 may be understood by referring now to FIG. 2, which is the portion of FIG. 1 circumscribed by the dashed box 95 shown at greater magnification. Because of the location of the dashed box 95, small portions of the semiconductor chips 15 and 20 are visible, as well as the electrically functional interconnects 50a, 50b, 55a and 55b, and the electrically non-functional interconnects 75a and 75b. Electrical conductivity say between the electrically functional interconnect 50a and the next upper electrically function interconnect 55a may be provided by forming a thru silicon via (TSV) 100a in the semiconductor chip 15. Since the semiconductor chips 15 and 20 may be constructed of other than silicon, the term "TSV" is intended to include materials in addition to silicon. A similar TSV 100b electrically connects the electrically functional interconnects 50b and 55b. The TSV 100a is electrically connected to the electrically functional interconnect 50a by way of a lower conductor pad 105a and an upper conductor pad 110a. The electrically functional interconnect 55a is, in-turn, connected to a TSV 115a in the semiconductor chip 20 by way of a conductor pad 120a. The TSV 100b is similarly electrically connected to the electrically functional interconnect 55a by way of a lower conductor pad 112b and an upper conductor pad 113b. Similar structures, though not separately labeled, are provided for the other electrically functional interconnects. The electrically non-functional interconnects 75a and 75b may be connected to dummy pads 125a and 125b, respectively, that are not electrically connected and thus float. The electrically non-functional interconnects 80a and 80b provide a thermal pathway for heat 90 to propagate up from the semiconductor chip 15 up to the semiconductor chip 20. The skilled artisan will appreciate that somewhere within the confines of the semiconductor chips 15 and 20 (and any of the other disclosed chips) active device regions with multitudes of integrated circuit elements such as transistors, resistors and others are positioned, preferably, but not necessarily proximate the front sides 130 and 132 of the semiconductor chips 15 and 20, respectively.

The TSVs 100a, 100b and 115a may be composed of a variety of conducting materials, such as copper, aluminum, gold, silver, platinum, palladium, combinations of these or the like. The conductor pads 105a, 112b, 110a, 113b and 120a may be composed of the same types of materials. The electrically functional interconnects 50a, 50b, 55a and 55b and the electrically non-functional interconnects 75a and 75b may also be composed of these same materials.

Figure 3:
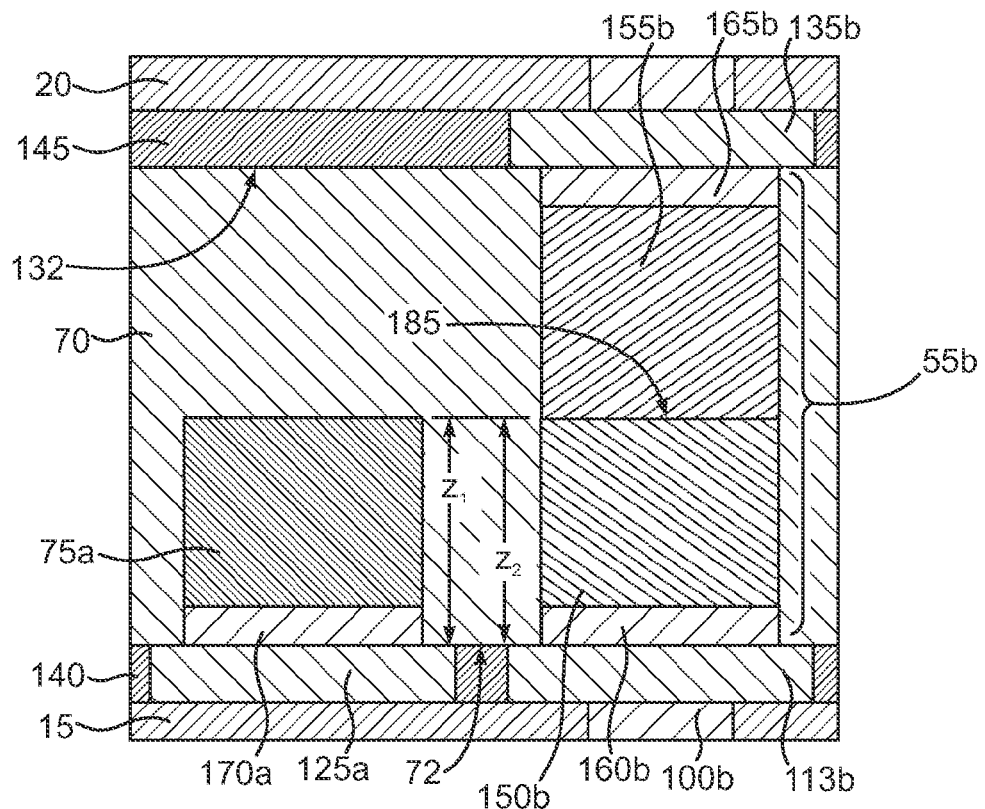
FIG. 3 is a portion of FIG. 2 shown at greater magnification.

Still further details of the electrically functional interconnects and the electrically non-functional interconnects may be understood by referring now to FIG. 3, which is the portion of FIG. 2 circumscribed by the dashed box 133 shown at greater magnification. Due to the location of the dashed box 133, FIG. 3 depicts the electrical non-functional interconnect 75a and the electrically functional interconnect 55b. Note also that because of the location of the dashed box 133, portions of the semiconductor chips 15 and 20, the underfill 70, the TSV 100b, the conductor pads 125a and 113b and an overlying conductor pad 135b are visible. In addition, interlevel dielectric layers 140 and 145 are depicted. The interlevel dielectric layers 140 and 145 may be one of several such layers that are positioned on the front and back sides of the semiconductor chips 15 and 20 depending on how many layers of interconnect metallization are utilized. The interlevel dielectric layers 140 and 145 may be composed of various insulating materials, such as silicon dioxide, silicon nitride, resins, such as epoxies or others. Here for simplicity of illustration, only a single metallization layer that includes the pads 125a and 125b and a similar single layer that encompasses the pad 135b are shown. However, the skilled artisan will appreciate that multiple layers of interlevel dielectric and metallization may be used. The electrically functional interconnect 55b may be a combination structure that consists of metallurgically bonded micro bumps 150b and 155b. The micro bump 150b projects from the back side 72 of the semiconductor chip 15 and may be metallurgically connected to the underlying pad 113b by way of a barrier film 160b, which may be a combination of tantalum and tantalum nitride sputter or otherwise deposited. The micro bump 155b projects from the front side 132 of the semiconductor chip 20 and may be metallurgically bonded to the pad 135b by way of a similar barrier metal film 165b composed of the materials just described. The electrically non-functional interconnect 75a projects from the back side 72 of the semiconductor chip 15 and may be a dummy micro bump similarly metallurgically connected to the conductor pad 125a by way of a barrier film 170a that may be composed of the same materials just described. Here, the electrically non-functional interconnect 75a may have a height $z_1$ measured from the interlevel dielectric layer 140. The height $z_1$ may be the same as the height $z_2$ of the micro bump 150. Optionally, the electrically non-functional interconnect 80a may have some height that differs from $z_2$. Indeed, the electrically non-functional interconnect 75a may be built to extend up to the front side 132 of semiconductor chip 20.

Figure 4:
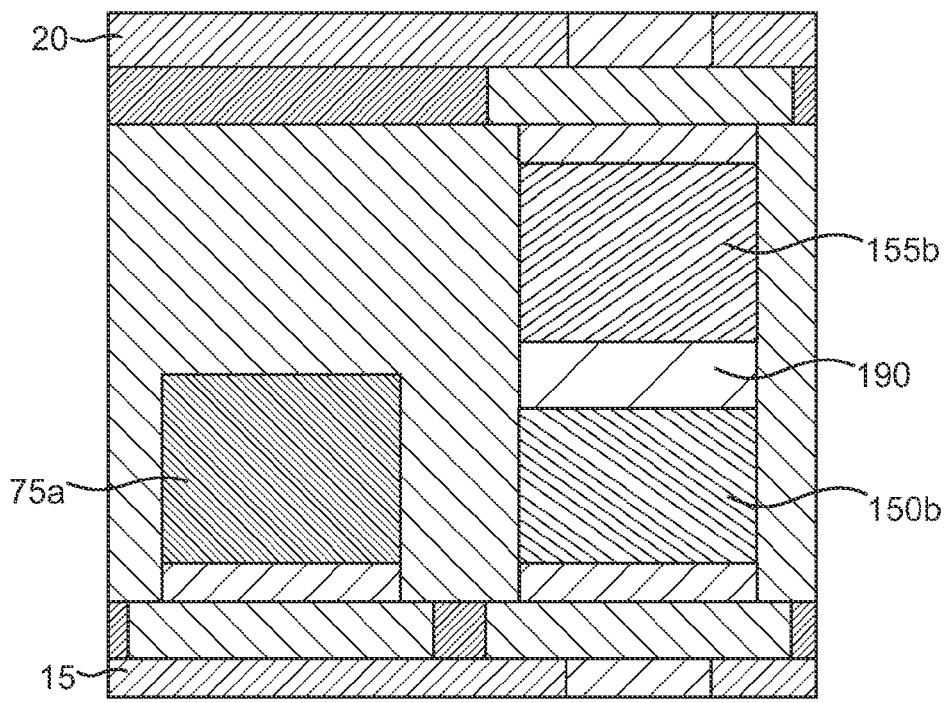
FIG. 4 is a sectional view like FIG. 3, but depicting an alternate exemplary electrically functional interconnect.

The micro bumps 150b and 155b may be joined at 185 in a variety of ways. For example, thermal compression bonding may be used to where the micro bumps 150b and 155b are composed of gold or other materials that are susceptible to that bonding technique. Various other techniques may be used. For example, and as shown in FIG. 4, which is a sectional view like FIG. 3 but of an alternate exemplary micro bump structure, a solder interface 190 is used between the micro bumps 150b and 155b. The other structures may be the same namely the electrically non-functional interconnect 75a and the semiconductor chips 15 and 20. A solder interface 190 may be suitable where thermal compression bonding is either unavailable due to the materials selected for the micro bumps 150b and 155b or some other consideration. For example, if copper is selected for the micro bumps 150b and 155b then the solder interface 190 may be appropriate to join those portions. Various lead or lead-free solders may be used, such as tin-lead (about 63% Sn and 37% Pb), tin-silver (about 97.3% Sn 2.7% Ag), tin-copper (about 99% Sn 1% Cu), tin-silver-copper (about 96.5% Sn 3% Ag 0.5% Cu) or the like.

Figure 5:
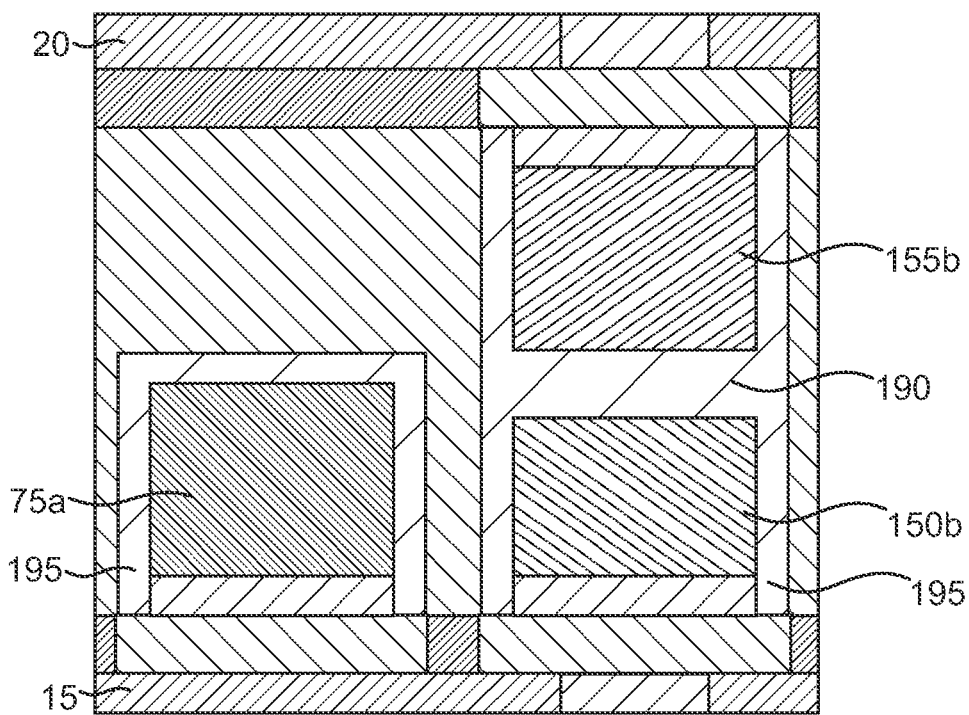
FIG. 5 is a sectional view like FIG. 4, but depicting another alternate exemplary electrically functional interconnect.

In still another alternate exemplary embodiment, depicted in FIG. 5, the micro bumps 150b and 155b and the electrically non-functional interconnect 75a may be clad in solder 195. The solder cladding can occur prior to the stacking of the semiconductor chips 15 and 20. Thus, at the time of bonding the solder clad 195 of the micro bump 150b and the solder clad 195 of the micro bump 155b will be brought together and a reflow will produce the solder interface 190. The electrically non-functional interconnect 75a may be provided with the solder cladding merely as a matter of convenience since the solder 195 will applied elsewhere to the semiconductor chip 15. However, a suitable mask (not shown) may be patterned so that the electrically non-functional interconnect 75a is not clad with the solder 195. In other respects, the device may be the same, namely the semiconductor chip 15 and the semiconductor chip 20 and the underfill 70 etc.

Figure 6:
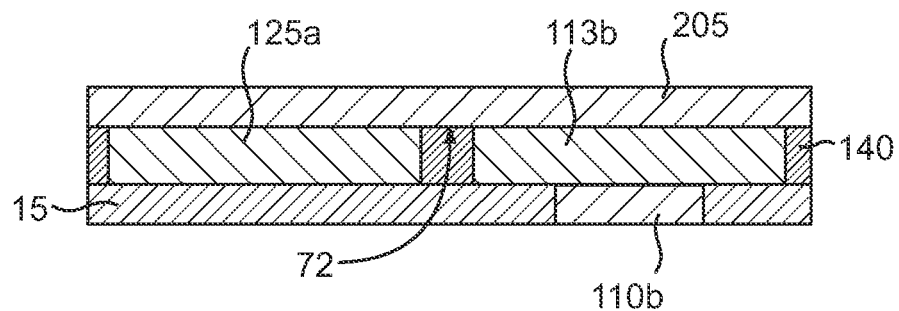
FIG. 6 is a sectional view of a small portion of an exemplary semiconductor chip undergoing barrier film processing.

An exemplary method for fabricating the electrically functional interconnect 55b and the electrically non-functional interconnect 75a may be understood by referring now to FIGS. 6, 7, 8, 9 and 10 and initially FIG. 6. The following description of the fabrication of the electrically functional interconnect 55b and the electrically non-functional interconnect 75a will be illustrative of the other micro bumps and the electrically non-functional interconnects depicted in FIGS. 1 and 2. It should be understood that the processing may be performed at the wafer or die level. Note that FIG. 6 depicts a small portion of the semiconductor chip 15 and in particular the back side 72 thereof. Here, a small portion of the TSV 110b and the conductor pads 125a and 125b are visible along with the interlevel dielectric layer 140. At this stage, the TSV 110b and the back side conductor pads 125a and 113b have been constructed using well-known techniques such as plating, chemical vapor deposition (CVD), physical vapor deposition (PVD or sputtering) or the like. A blanket barrier film 205 that will be ultimately patterned into the barrier films 170a and 160b depicted in FIG. 3 is initially blanket deposited by PVD, CVD or other techniques.

Figure 7:
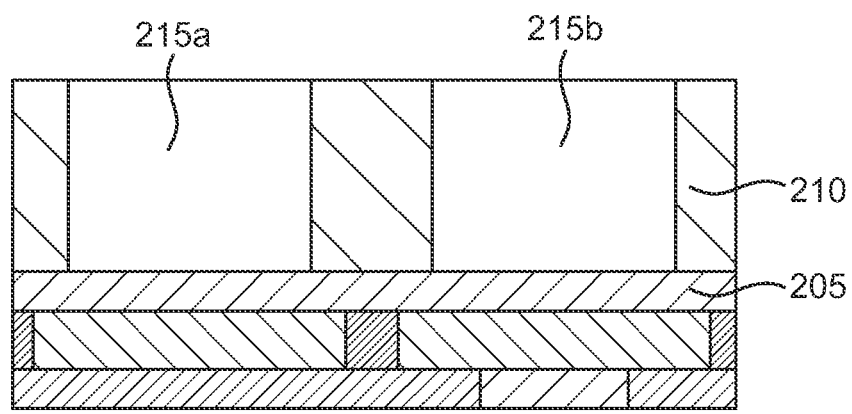
FIG. 7 is a sectional view like FIG. 6, but depicting additional lithographic processing of the semicondutor chip.
Figure 8:
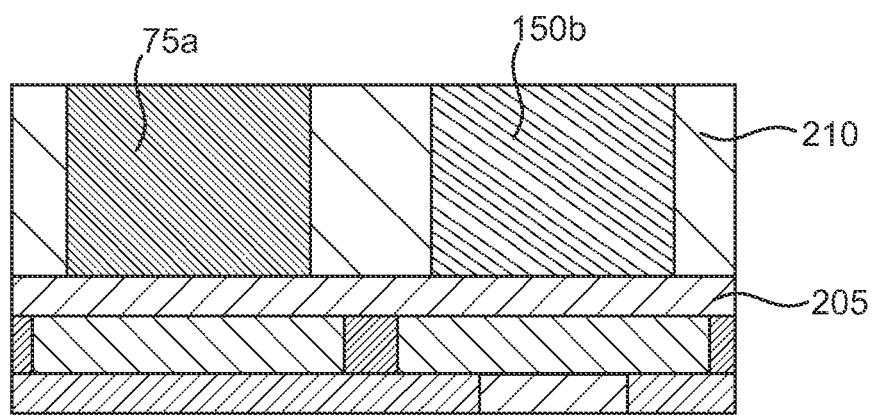
FIG. 8 is a sectional view like FIG. 7, but depicting fabrication of exemplary electrically non-functional and functional interconnects.
Figure 9:
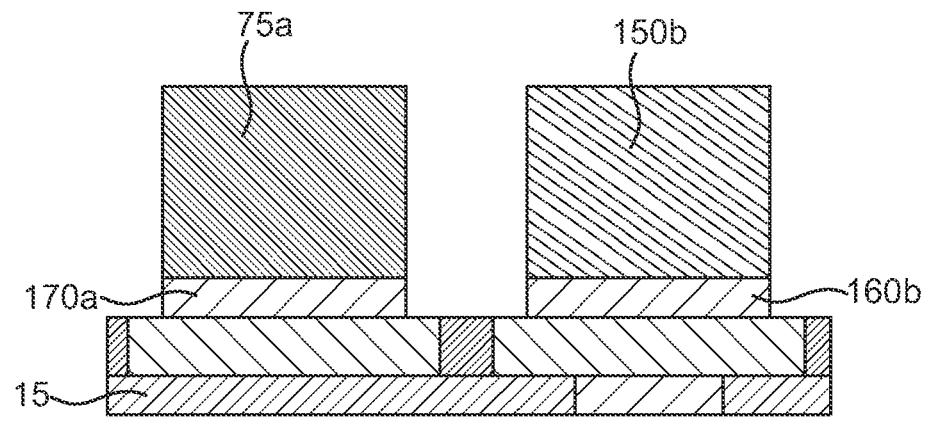
FIG. 9 is a sectional view like FIG. 8, but depicting additional barrier film processing.

Referring now to FIG. 7, a suitable lithography mask 210 may be formed on the barrier film 205 and patterned with suitable openings 215a and 215b. Next and as shown in FIG. 8, a material deposition process may be used to establish the electrically non-functional interconnect 75a and the micro bump 150b on the barrier film 205 using the lithography mask 210. A variety of techniques may be suitable to form the electrically non-functional interconnect 75a and the micro bump 150b. In an exemplary embodiment, flash gold plating may be used. Following the application of the electrically non-functional interconnect 75a and the micro bump 150b, the lithography mask 210 may be stripped as shown in FIG. 9 and a suitable etch process used to etch the barrier film 205 shown in FIG. 8 using the electrically non-functional interconnect 75a and the micro bump 150b as etch masks to define the barrier film portions 170a and 160b.

Figure 10:
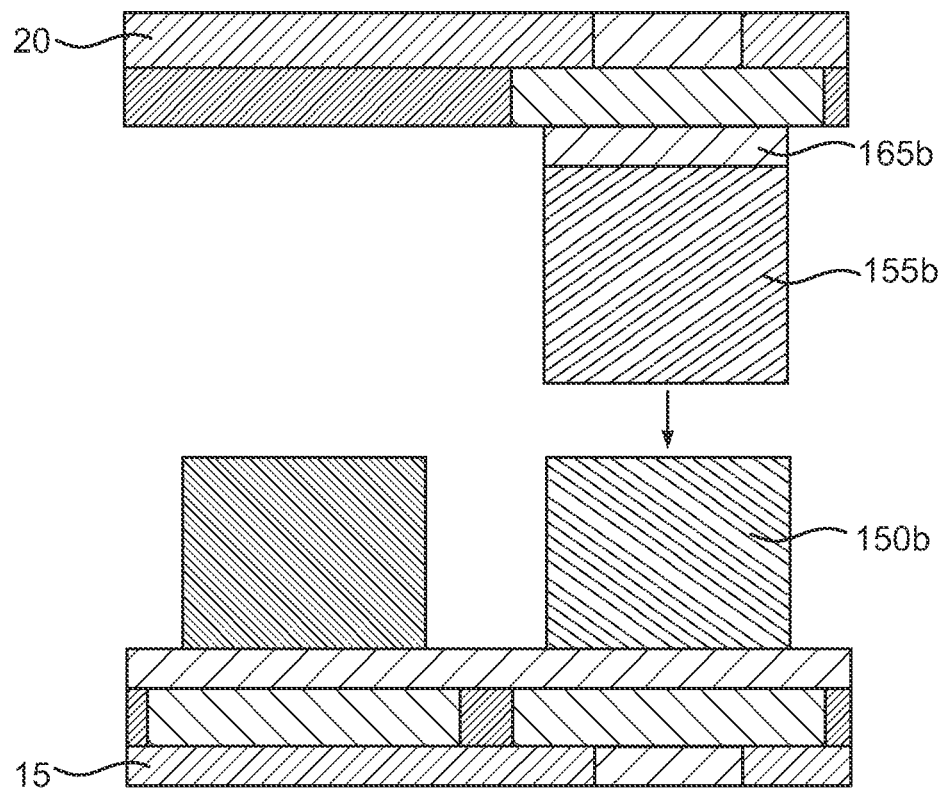
FIG. 10 is a sectional view like FIG. 9, but depicting exemplary stacking of a second semiconductor chip on the first.
Figure 11:
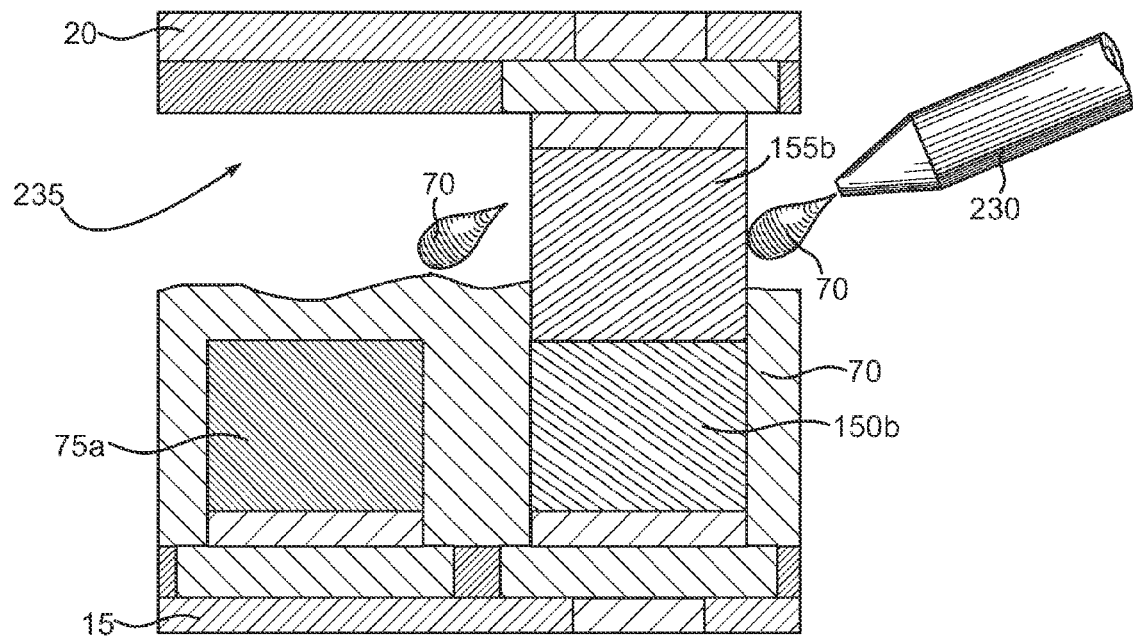
FIG. 11 is a sectional view like FIG. 10, but depicting exemplary application of an insulating underfill.

At this stage, the semiconductor chip 15 is ready to be stacked with the semiconductor chip 20 as shown in FIG. 10. It should be noted that the semiconductor chip 20 has been provided with the micro bump 155b and the barrier film 165b using the same types of techniques just described for the micro bump 150b. The semiconductor chip 20 is moved into proximity with the semiconductor chip 15 so that the micro bumps 150b and 155b are touching or otherwise close enough to be subjected to thermal compression bonding by way of a heating process. Following the thermal compression bonding, the micro bump 55b consisting of the micro bumps 150b and 155b are established. Thereafter, and as shown in FIG. 11, the underfill material 70 may be dispensed between the semiconductor chips 15 and 20 using a suitable applicator 230. The underfill should fill the entirety of the gap 235 between the semiconductor chips 15 and 20. After dispensing, the underfill 70 may undergo one or more bake processes to establish cure. The underfill will advantageously fill the gap 235 and surround the micro bumps 150b and 155b and the electrically non-functional interconnect 75a. Together, the electrically non-functional interconnect 75a and the underfill 70 define a thermal pathway to convey heat.

In lieu of capillary action, an underfill application may precede chip stacking and interconnect bonding, particularly where thermal compression bonding is used to establish bonding between the interconnect structures of the semiconductor chips 15 and 20. In one embodiment, a non-conducting paste (NCP) is applied to one or the other of the semiconductor chips 15 and 20 and then the chips 15 and 20 are stacked and interconnect bonding, such as by thermal compression bonding, is performed. In another embodiment, a non-conducting film (NCF) may be used in lieu of or with an NCP. It may be possible to combine NCP and NCF. A NCP could be used nearer central regions and a NCF at the perimeters of the semiconductor chips 15 and 20 or vice versa. Stacking and thermal compression bonding will follow.

Figure 12:
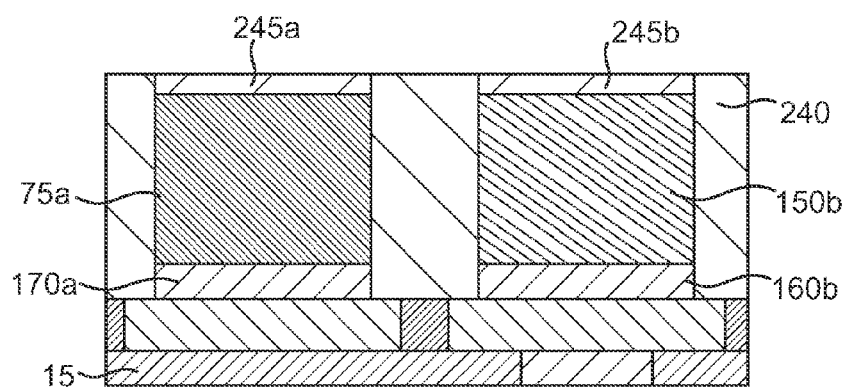
FIG. 12 is a sectional view like FIG. 8, but depicting an alternate exemplary fabrication of electrically non-functional and functional interconnects.
Figure 13:
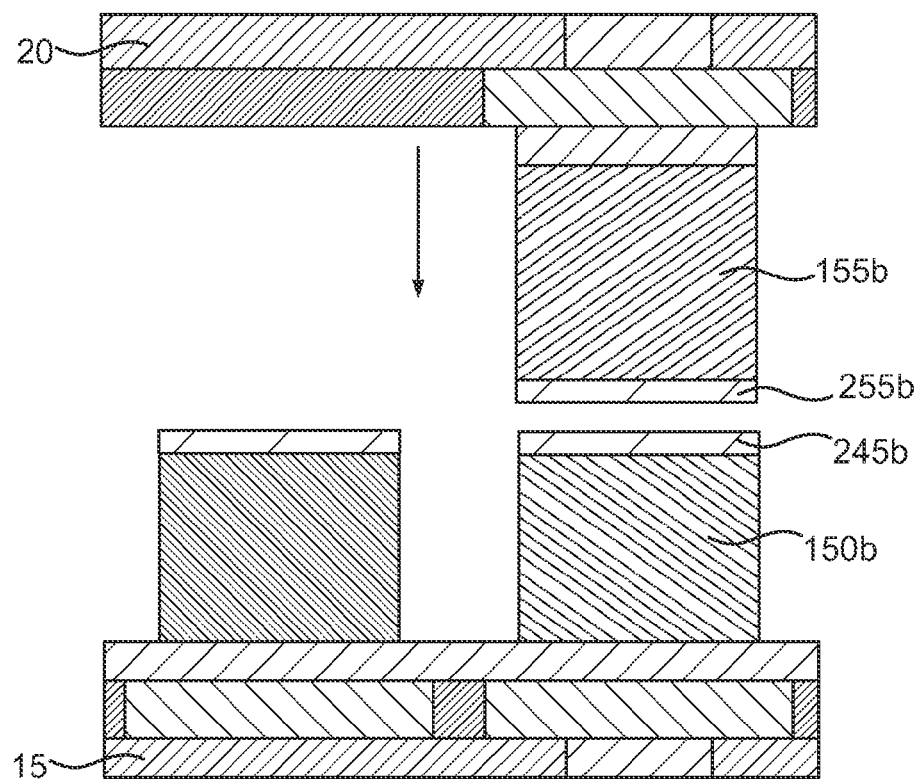
FIG. 13 is a sectional view like FIG. 12, but depicting exemplary stacking of a second semiconductor chip on the first.

An alternate exemplary process where a solder cap or even cladding is used for at least the micro bump 150b may be understood by referring now to FIG. 12. Here, the electrically non-functional interconnect 75a and the micro bump 150b may be fabricated as described above and thus be positioned on the barrier films 170a and 160b, respectively. However, a suitable lithography mask 240 may be applied to the semiconductor chip 15 with openings above the electrically non-functional interconnect 75a and the micro bump 150b so that solder portions 245a and 245b may be applied to the electrically non-functional interconnect 75a and the micro bump 150b. Thereafter, the mask 240 may be stripped using well-known techniques and a similar process to fabricate the micro bump 155a performed on the semiconductor chip 20 as shown in FIG. 13. Thereafter, the semiconductor chips 15 and 20 may be brought together so that the solder cap 245b of the micro bump 150b is brought into close proximity or contact with a corresponding solder cap 255b of the micro bump 155b and reflow performed to establish the solder interface 190 as shown in FIG. 4. Of course a similar process may be used if solder cladding is used, for example, as shown in FIG. 5.

Figure 14:
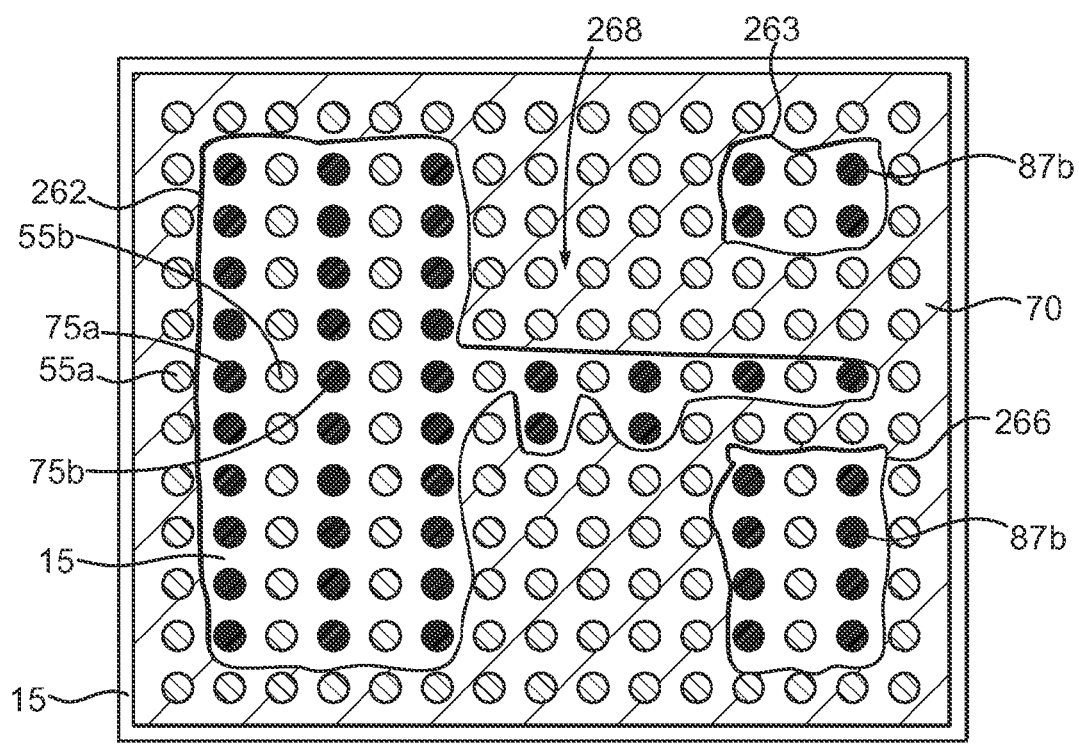
FIG. 14 is a sectional view of FIG. 1 taken at section 14-14.

The electrically non-functional interconnects 75a, 75b, 80a and 80b depicted in FIG. 1, for example, may be arranged in patterns that facilitate heat transfer from particular sites that are prone to high temperatures. It is possible to thermally map two adjacent semiconductor chips, say the chips 15 and 20, and determine where the greatest heat is generated. In this regard, attention is now turned to FIG. 14, which is a sectional view of FIG. 1 taken at section 14-14. Note that because of the location of section 14-14, the electrically functional interconnects 55a and 55b, etc. between the chips 15 and 20 are shown in section along with some of the electrically non-functional interconnects 75a and 75b. To illustrate additional features, portions of the underfill 70 are cut away at 262, 263 and 266.

Note that the cut away sections 262, 263 and 266 reveal portions of the underlying semiconductor chip 15. The electrical functional interconnects 55a and 55b are shown in section along with the other corresponding micro bumps that are not separately labeled. However, the electrically non-functional interconnects 75a, 75b and the others are shown as black dots to provide better contrast and readability. In this particular embodiment, it is assumed that a thermal mapping of the semiconductor chip 15 reveals that the portion thereof at the cut out 262 generates a significant amount of heat (and/or receives significant heat from the underlying substrate 35 shown in FIG. 1) that must be conveyed away, preferably upward to the semiconductor chip 20 shown in FIG. 1. Thus, the portion below the cut away region 262 is heavily populated with the electrically non-functional interconnects 75a, 75b, etc. However, the generally central portion 268 of the semiconductor chip 25 has a relatively lower heat flux and thus may not require the electrically non-functional interconnects. Similarly, the areas of the semiconductor chip 15 at the cut outs 263 and 266 may have higher heat flux but over smaller areas and thus need only be populated with a few of the electrically non-functional interconnects collectively labeled 87b. Again great flexibility is envisioned regarding the number and arrangement of the electrically non-functional interconnects 75a, 75b, 87b, etc.

Figure 15:
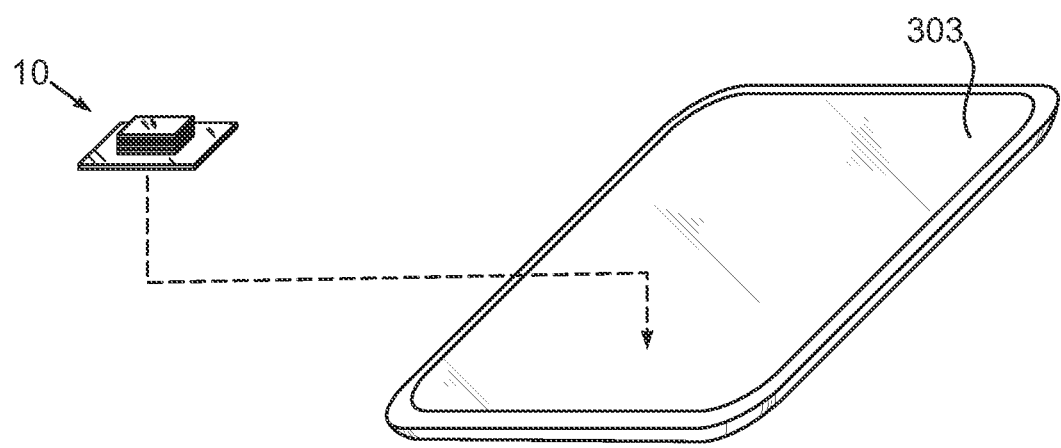
FIG. 15 is pictorial view depicting the semiconductor chip device exploded from an exemplary electronic device.

Any of the disclosed embodiments of the semiconductor chip device 10 may be incorporated into another electronic device such as the electronic device 303 depicted in FIG. 15. The electronic device 303 may be a computer, a server, a hand held device, or virtually any other electronic component.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    fabricating a first plurality of electrically functional interconnects on a front side of a first semiconductor chip; and
    fabricating a first plurality of electrically non-functional interconnects on a back side of the first semiconductor chip, each of the electrically non-functional interconnects including a dummy pad that does not extend through to the front side of the first semiconductor chip.

2. The method of claim 1, comprising fabricating a second plurality of electrically functional interconnects on the back side of the first semiconductor chip.

3. The method of claim 2, wherein each of the second electrically functional interconnects comprises a first micro bump.

4. The method of claim 3, wherein each of second electrically functional interconnects comprises a second micro bump bonded to the first micro bump.

5. The method of claim 2, comprising stacking a second semiconductor chip on the first semiconductor chip, the second semiconductor chip having a front side facing the back side of the first semiconductor chip and a back side.

6. The method of claim 5, wherein each of second electrically functional interconnects comprises a first micro bump projecting from the back side of the first semiconductor chip and a second micro bump projecting from the front side of the second semiconductor chip and being bonded to the first micro bump.

7. The method of claim 1, comprising mounting the first semiconductor chip on a substrate.

8. The method of claim 7, wherein the substrate comprises a semiconductor chip.

9. The method of claim 1, wherein the electrically non-functional interconnects comprise micro bumps.

10. A method of manufacturing, comprising:
stacking a first semiconductor chip on a second semiconductor chip, the first semiconductor chip having a front side facing a back side of the second semiconductor chip, the second semiconductor chip having a front side, the back side of the second semiconductor chip having plural electrically non-functional interconnects, each of the electrical non-functional interconnects including a dummy pad that does not extend through to the front side of the second semiconductor chip;
electrically connecting the first and second semiconductor chips with plural electrically functional interconnects between the front side of the first semiconductor chip and the back side of the second semiconductor chip; and
depositing an insulating material between the first and second semiconductor chips to establish thermal contact with plural electrically non-functional interconnects.

11. The method of claim 10, comprising stacking a third semiconductor chip on the first semiconductor chip.

12. The method of claim 10, wherein each of the electrically functional interconnects comprises a first micro bump projecting from the back side of the second semiconductor chip and a second micro bump projecting from the front side of the first semiconductor chip and being bonded to the first micro bump.

13. The method of claim 10, comprising mounting the second semiconductor chip on a substrate.

14. The method of claim 13, wherein the substrate comprises a semiconductor chip.

15. The method of claim 10, wherein the electrically non-functional interconnects comprise micro bumps.

16. An apparatus, comprising:
a first semiconductor chip having a front side and a back side; and
a first plurality of electrically functional interconnects on the front side and first plurality of electrically non-functional interconnects on the back side, each of the electrically non-functional interconnects including a dummy pad that does not extend through to the front side.

17. The apparatus of claim 16, comprising a second plurality of electrically functional interconnects on the back side.

18. The apparatus of claim 17, wherein each of the second electrically functional interconnects comprises a first micro bump.

19. The apparatus of claim 18, wherein each of second electrically functional interconnects comprises a second micro bump bonded to the first micro bump.

20. The apparatus of claim 17, comprising a second semiconductor chip stacked on the first semiconductor chip, the second semiconductor chip having a front side facing the back side of the first semiconductor chip and a back side.

21. The apparatus of claim 20, wherein each of second electrically functional interconnects each of second electrically functional interconnects comprises a first micro bump projecting from the back side of the first semiconductor chip and a second micro bump projecting from the front side of the second semiconductor chip and being bonded to the first micro bump.

22. The apparatus of claim 16, comprising a substrate, the first semiconductor chip being mounted on the substrate.

23. The apparatus of claim 22, wherein the substrate comprises a semiconductor chip.

24. The apparatus of claim 16, wherein the electrically non-functional interconnects comprise micro bumps.

* * * * *